United States Patent
Bergenek

(10) Patent No.: US 10,533,729 B2
(45) Date of Patent: Jan. 14, 2020

(54) LIGHT SOURCE WITH LED CHIP AND LUMINOPHORE LAYER

(71) Applicant: OSRAM GmbH, Munich (DE)

(72) Inventor: Krister Bergenek, Regensburg (DE)

(73) Assignee: OSRAM GmbH, Munich (DE)

( * ) Notice: Subject to any disclaimer, the term of this patent is extended or adjusted under 35 U.S.C. 154(b) by 1189 days.

(21) Appl. No.: 14/377,508

(22) PCT Filed: Feb. 18, 2013

(86) PCT No.: PCT/EP2013/053201
§ 371 (c)(1),
(2) Date: Aug. 8, 2014

(87) PCT Pub. No.: WO2013/127653
PCT Pub. Date: Sep. 6, 2013

(65) Prior Publication Data
US 2014/0376223 A1    Dec. 25, 2014

(30) Foreign Application Priority Data

Feb. 27, 2012  (DE) .................. 10 2012 202 927

(51) Int. Cl.
*F21V 13/02* (2006.01)
*F21V 9/32* (2018.01)
*F21K 9/64* (2016.01)

(52) U.S. Cl.
CPC .............. *F21V 13/02* (2013.01); *F21K 9/64* (2016.08); *F21V 9/32* (2018.02)

(58) Field of Classification Search
CPC . H01L 33/504; F21K 9/64; F21K 9/56; F21K 99/00; F21V 13/02; F21V 9/30; F21V 9/32; F21Y 2115/10

USPC ......................................................... 362/235
See application file for complete search history.

(56) References Cited

U.S. PATENT DOCUMENTS

| 4,379,621 | A | * | 4/1983 | Ikedo | G02F 1/0555 |
| | | | | | 348/795 |
| 5,998,925 | A | | 12/1999 | Shimizu et al. | |
| 7,250,715 | B2 | * | 7/2007 | Mueller | C09K 11/0883 |
| | | | | | 313/485 |
| 7,485,243 | B2 | * | 2/2009 | Hintzen | C04B 35/597 |
| | | | | | 252/301.4 F |

(Continued)

FOREIGN PATENT DOCUMENTS

CN      101847680 A    9/2010
DE      29724458 U1    4/2001

(Continued)

OTHER PUBLICATIONS

Chinese Office Action based on Application No. 201380008538(7 Pages and 6 pages of English translation) dated Mar. 29, 2016 (Reference Purpose Only).

(Continued)

*Primary Examiner* — Peggy A Neils
(74) *Attorney, Agent, or Firm* — Viering, Jentschura & Partner MBB

(57) ABSTRACT

A light source may include an LED chip having a light-emitting surface, on which a luminophore layer is arranged. The luminophore layer may include adjacently arranged regions having different luminophores. A lighting device may include at least one light source.

20 Claims, 3 Drawing Sheets

(56) References Cited

U.S. PATENT DOCUMENTS

| | | | |
|---|---|---|---|
| 7,521,862 B2* | 4/2009 | Mueller | C04B 35/584 |
| | | | 313/506 |
| 7,554,258 B2 | 6/2009 | Rossner et al. | |
| 7,982,233 B2 | 7/2011 | Berben et al. | |
| 7,994,530 B2 | 8/2011 | Weijers et al. | |
| 8,247,828 B2* | 8/2012 | Bechtel | H01L 33/504 |
| | | | 257/89 |
| 8,263,422 B2* | 9/2012 | Yu | H01L 33/145 |
| | | | 257/E21.001 |
| 8,354,784 B2* | 1/2013 | Yuan | H05B 33/14 |
| | | | 313/483 |
| 8,558,448 B2* | 10/2013 | Harada | H01L 33/504 |
| | | | 313/498 |
| 8,672,497 B2* | 3/2014 | Park | F21V 5/007 |
| | | | 362/84 |
| 9,159,886 B2* | 10/2015 | Ng | H01L 33/504 |
| 9,379,103 B2* | 6/2016 | Aebischer | H01L 21/823892 |
| 2003/0100446 A1* | 5/2003 | Hase | B01D 53/945 |
| | | | 502/302 |
| 2004/0145308 A1 | 7/2004 | Rossner et al. | |
| 2005/0269582 A1* | 12/2005 | Mueller | C04B 35/44 |
| | | | 257/94 |
| 2007/0024173 A1 | 2/2007 | Braune | |
| 2007/0241349 A1 | 10/2007 | Kishioka | |
| 2009/0039365 A1* | 2/2009 | Andrews | H01L 33/508 |
| | | | 257/98 |
| 2009/0261273 A1* | 10/2009 | Sakurai | G21K 4/00 |
| | | | 250/484.4 |
| 2009/0272998 A1 | 11/2009 | Berben et al. | |
| 2010/0129598 A1* | 5/2010 | Su | H01L 33/504 |
| | | | 428/116 |
| 2010/0142181 A1* | 6/2010 | Schmidt | C04B 35/593 |
| | | | 362/84 |
| 2010/0148200 A1 | 6/2010 | Lai et al. | |
| 2010/0276714 A1* | 11/2010 | Berben | C09K 11/7734 |
| | | | 257/98 |
| 2011/0025190 A1 | 2/2011 | Jagt | |
| 2011/0148279 A1 | 6/2011 | Li et al. | |
| 2011/0149549 A1* | 6/2011 | Miyake | F21V 7/22 |
| | | | 362/84 |
| 2011/0186778 A1* | 8/2011 | Becker | C09K 11/0883 |
| | | | 252/301.4 R |
| 2011/0248295 A1* | 10/2011 | Stauss | H01L 25/0753 |
| | | | 257/89 |
| 2012/0007130 A1* | 1/2012 | Hoelen | H01L 33/504 |
| | | | 257/98 |
| 2012/0193657 A1 | 8/2012 | von Malm et al. | |
| 2012/0320607 A1* | 12/2012 | Kinomoto | H01L 27/322 |
| | | | 362/351 |
| 2013/0016505 A1 | 1/2013 | Gianordoli | |
| 2013/0094179 A1* | 4/2013 | Dai | H05B 33/14 |
| | | | 362/84 |
| 2013/0320384 A1* | 12/2013 | Liepold | B32B 18/00 |
| | | | 257/98 |
| 2013/0327947 A1 | 12/2013 | Ronda et al. | |
| 2014/0217454 A1 | 8/2014 | Huckenbeck et al. | |

FOREIGN PATENT DOCUMENTS

| | | |
|---|---|---|
| DE | 10349038 A1 | 5/2004 |
| DE | 102006024165 A1 | 11/2007 |
| DE | 102009032606 A1 | 1/2011 |
| DE | 102009037186 A1 | 2/2011 |
| DE | 202010007032 U1 | 9/2011 |
| DE | 202011106052 U1 | 12/2011 |
| KR | 1020090015987 A | 2/2009 |
| WO | 2004093203 A2 | 10/2004 |
| WO | 2007102095 A1 | 9/2007 |
| WO | 2009115998 A2 | 9/2009 |
| WO | 2011003726 A1 | 1/2011 |

OTHER PUBLICATIONS

International Search Report issued in PCT/EP2013/053201 dated May 16, 2013.
German Office Action issued in DE10 2012 202 927.3 dated Oct. 26, 2012.
Notification of Reason for Refusal issued for corresponding application No. 10-2014-7027242, dated May 30, 2019, 5 pages + 5 pages translation (for informational purpose only).

* cited by examiner

LIGHT SOURCE WITH LED CHIP AND LUMINOPHORE LAYER

RELATED APPLICATIONS

The present application is a national stage entry according to 35 U.S.C. § 371 of PCT application No.: PCT/EP2013/053201 filed on Feb. 18, 2013, which claims priority from German application No.: 10 2012 202 927.3 filed on Feb. 27, 2012, and is incorporated herein by reference in its entirety.

TECHNICAL FIELD

Various embodiments relate to a light source including an LED chip having a light-emitting surface, on which a luminophore layer is arranged.

BACKGROUND

Light-emitting diodes in which an LED chip emits primary light with a first wavelength (for example blue light) on a light-emitting surface and the light-emitting surface is covered with silicone, with which a first luminophore and a second luminophore are admixed as fillers, are known. The first luminophore converts the primary light partially into a first secondary light with a longer wavelength (for example into green light) and the second luminophore converts the primary light partially into a second secondary light with a different even longer wavelength (for example into red light). The light-emitting diode consequently emits a mixed light including a proportion of the primary light, a proportion of the first secondary light and a proportion of the second secondary light, for example a white or whitish (for example warm-white) mixed light.

In this case, it is disadvantageous that the first secondary light with the shorter wavelength may be converted partially by the second luminophore into the second secondary light with the wavelength longer than it. This multiple wavelength conversion process leads to a quantum efficiency loss as well as to a less attractive spectrum with a low color rendering index of typically about 80. Furthermore, the refractive index difference between the luminophores and the silicone leads to further absorption losses. The low thermal conductivity of silicon, about 0.1 to 0.2 W/(m·K) furthermore leads to a high temperature of the luminophores, which limits a possible luminous flux density, reduces the conversion efficiency (particularly of nitridic or nitride-ceramic red luminophore) and can lead to degradation of the luminophores.

The problem of multiple wavelength conversion can so far be solved in lighting devices having a plurality of light-emitting diodes by a first subgroup of the light-emitting diodes including a luminophore layer having only the first luminophore, and a second subgroup of the light-emitting diodes including a luminophore layer having only the second luminophore. This allows a high color rendering index of about 90. A disadvantage in this case is that a plurality of light-emitting diodes are required therefor and a color homogeneity is lower, in particular at large angles with respect to the main emission direction.

The problem of the poor thermal conductivity of the luminophore layer can so far be solved by using ceramic luminophore layers. Such ceramic luminophore layers include a ceramic base material to which at least one activator (often a rare earth such as Ce or Eu) is added. By addition of an activator, the capacity for wavelength conversion is imparted to the ceramic luminophore layer. The ceramic base material (without activator) is typically transparent or translucent.

The ceramic luminophore layers may in particular be produced in a similar way to other ceramic bodies, for example by sintering preshaped green bodies, and thus consist essentially of the ceramic luminophore (possibly with small amounts of sintering auxiliaries or the like remaining). The use of ceramic luminophore layers has the advantage that they allow efficient wavelength conversion (for example at least 10% more efficient for wavelength conversion to green or yellow), are thermally conductive to a high degree (at about 10 W/(m·K)), are mechanically stable and exhibit little light attenuation. A disadvantage is that although green and yellow ceramic luminophores can be produced relatively simply and economically, red ceramic luminophores cannot.

SUMMARY

Various embodiments provide a possibility for efficient and economical generation of a mixed light from at least two secondary light components.

Various embodiments provide a light source including an LED chip having a light-emitting surface, on which a luminophore layer is arranged, wherein the luminophore layer includes adjacently arranged regions having different luminophores. By virtue of the adjacently lying arrangement of the luminophores, mutual influence or reabsorption is significantly reduced in comparison with a previously used luminophore mixture, and a high color rendering index is thus provided. Nevertheless, a single light source may include a plurality of luminophores.

The number of luminophores is in principle not limited, and may include two or even more luminophores, for example a green, yellow and/or red luminophore.

It is one configuration that a first region includes a first luminophore and at least one second region includes a second luminophore, and the at least one second region is arranged in a respective recess of the first region. This allows integration of differently producible luminophore regions, in particular a first region which is readily manageable in terms of production technology, for example mechanically stable, and filling of the at least one recess with a second luminophore or region which is less readily manageable in terms of production technology and/or easy to fill with. A size of the recess, an amount of the second luminophore, and consequently also the conversion factor of the second region in the recess can be dimensioned relatively precisely, which aids precise adjustment of overall color locus of the mixed light even of a single light source.

Of course, the first region may also include at least one recess for a third or even further luminophore, which form corresponding third or further regions.

The shape of the recess (in plan view) is not restricted, a circular round shape being preferred in terms of production technology. A polygonal, oval or freeform shape, for example, may however also be used.

The recess is preferably continuous for simple production and strong illumination with the primary light.

It is a configuration thereof that the first luminophore is a ceramic luminophore and the first region is a ceramic layer made from the first luminophore. This has all the advantages of ceramic luminophore layers, and is in particular mechanically stable and allows precise introduction of the recesses, for example by corresponding shaping of a green body.

It is one refinement that the ceramic layer is provided as a platelet (with a constant thickness). This allows a conversion factor which is uniform to a high degree over the area of the ceramic layer.

It is yet another configuration that a thickness of the ceramic luminophore layer lies between about 30 and about 350 micrometers. Such a layer thickness allows low light losses together with precise adjustment of the conversion factor, up to the extent of almost complete conversion with a conversion factor of about 98% or more.

It is furthermore a configuration that the ceramic layer includes a lower subregion (lower substratum or layer) not provided (for example doped) with activator(s) and an upper subregion (upper substratum or layer) provided (for example doped) with at least one activator. This offers the advantage that the wavelength conversion takes place further away from (above) the light-emitting surface of the LED chip, and consequently a smaller part of the first secondary light emitted (isotropically) by the first luminophore strikes the light-emitting surface than in the case of wavelength conversion close to the light-emitting surface of the LED chip. This increases an efficiency, since the LED chip usually has a low reflectivity. Another advantage is that in this way a smaller area of the recess(es) of the first region is required because a larger amount of primary light strikes the second luminophore located in the recesses, or the at least one second (luminophore) region. This can also be advantageous in terms of production technology, and it furthermore allows a shorter thermal path through the second region, or the second luminophore (particularly through a silicone used as a matrix material) to the (in particular ceramic and consequently highly thermally conductive) first region, and thus improved heat dissipation.

The lower subregion of the ceramic layer consists, in particular, of a transparent or translucent ceramic material.

It is also a configuration that the ceramic layer includes Ce-doped LuAG or YAG as a ceramic luminophore. The Ce may, in particular, be incorporated as activator ion $Ce^{3+}$. It is a refinement that Ce or $Ce^{3+}$ is present with a concentration of between about 0.5% and 3%.

It is an alternative configuration that the ceramic layer includes as a ceramic lumiphore (Ba,Sr)—SiON doped with Eu as an activator. Eu may, in particular, be incorporated as activator ion $Eu^{2+}$. It is a refinement that Eu or $Eu^{2+}$ is present with a concentration of between about 0.5% and 2%.

It is furthermore a configuration that the second luminophore is present as a filler embedded in an encapsulation material, in particular silicone. The at least one recess may be filled with such a second luminophore particularly easily, for example by doctor blading. The second luminophore may, in particular, be a red luminophore which generates red second secondary light.

It is a configuration thereof that the second luminophore is an Eu-doped nitride-ceramic luminophore. It is a refinement thereof that the second luminophore is or includes $(Sr,Ba,Ca)_2Si_5N_8$:Eu or $(Sr,Ca)AlSiN_3$:Eu. Eu may, in particular, be incorporated as activator ion $Eu^{2+}$.

It is furthermore a configuration that a surface fraction of the second region lies between about ⅓ and about ⅔. This allows, on the one hand, a sufficiently high proportion of the second secondary light and sufficient stability and manageability of the first region.

The object is also achieved by a lighting device including at least one light source as described above.

It is one configuration that the lighting device includes or is a housed light source. This allows provision of a single light source with improved properties. The housed light source may, in particular, be a housed light-emitting diode.

It is another configuration that the lighting device includes a plurality of light sources fitted on a common carrier. The lighting device may, in particular, be a lighting module or a lamp.

It is a configuration thereof that a common diffusing element is arranged optically downstream of the light sources. This increases a uniformity of the light emitted by the lighting device, particularly in respect of its brightness or color.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

The following detailed description refers to the accompanying drawing that show, by way of illustration, specific details and embodiments in which the disclosure may be practiced.

Figure 1:
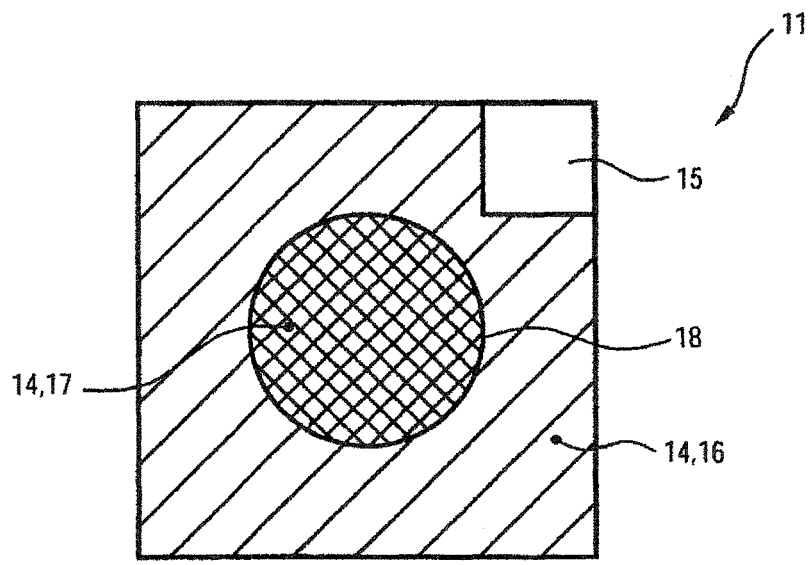
FIG. 1 shows a light source according to a first embodiment in plan view.
Figure 2:
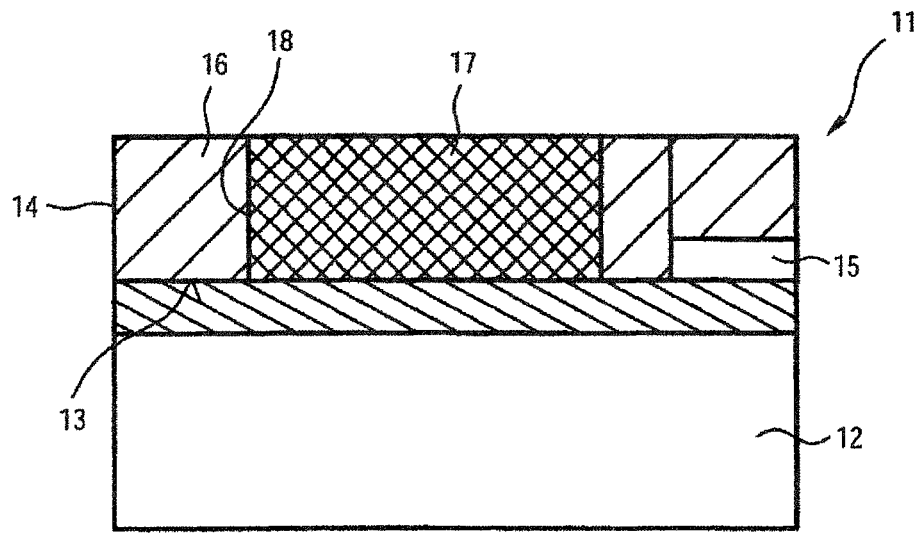
FIG. 2 shows the light source according to the first embodiment as a sectional representation in side view.

FIG. 1 shows a light source 11 according to a first embodiment in plan view. FIG. 2 shows the light source 11 as a sectional representation in side view. The light source 11 includes an LED chip 12 having a light-emitting surface 13 on the upper side, and on which a luminophore layer 14 is arranged. Blue primary light, for example with a peak wavelength of between 440 nm and 460 nm, can be emitted from the light-emitting surface 13.

The luminophore layer 14 covers the light-emitting surface 13 fully except for a recess for a bonding pad 15 of the LED chip 12. The other electrical contact of the LED chip 12 is provided on the lower side (not shown).

The luminophore layer 14 includes two adjacently arranged regions 16, 17 having different luminophores, namely a first region 16 having a first luminophore and a circular recess 18 extending through perpendicularly, and a second region 17 filling the recess 18 and having a second luminophore. A surface fraction of the second region 17 (in plan view) is in this case about ⅓.

The first luminophore converts the blue primary light at least partially into green or green-yellow secondary light. The first luminophore is a ceramic luminophore and in this case includes, in particular, LuAG or YAG doped with Ce as an activator, in particular with a Ce concentration of between about 0.5% and 3%, or Sr—SiON doped with Eu as an activator, with an Eu concentration of between about 0.5% and 2%. The first luminophore forms the first region 16 as a platelet with a thickness of between about 30 and about 350 micrometers.

The second region 17 present in the recess 18 is formed as an encapsulation material with a transparent polymer (here: silicone) as base material, in which the second luminophore is embedded as a filler material in the form of luminophore particles. The second luminophore converts the blue primary light at least partially into red secondary light. In this case, the second luminophore is in particular a nitride-ceramic material doped with Eu as an activator, in particular $(Sr,Ba,Ca)_2Si_5N_8$:Eu or $(Sr,Ca)AlIN_3$:Eu.

The light emitted by the light source 11 is in this case a warm-white mixed light with a color temperature of between 2700 K and 3000 K, consisting of the unconverted part of the primary light, the first secondary light and the second secondary light.

Figure 3:
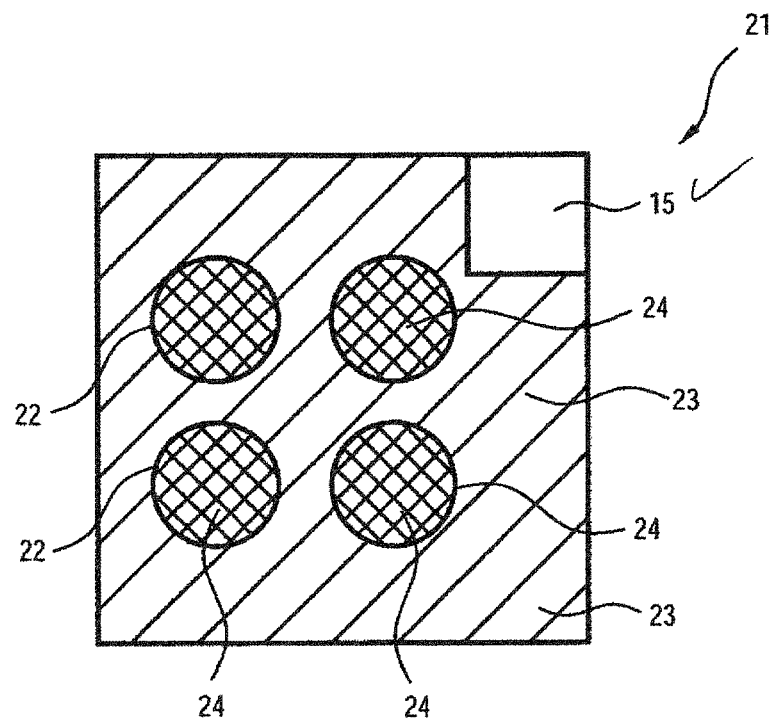
FIG. 3 shows a light source according to a second embodiment in plan view.

FIG. 3 shows a light source 21 according to a second embodiment in plan view. The light source 21 differs from the light source 11 in that it includes four recesses 22 in the first region 23, although these have only one fourth of the area of the recess 18. The recesses 22 are filled with respective second regions 24 having the second luminophore.

Figure 4:
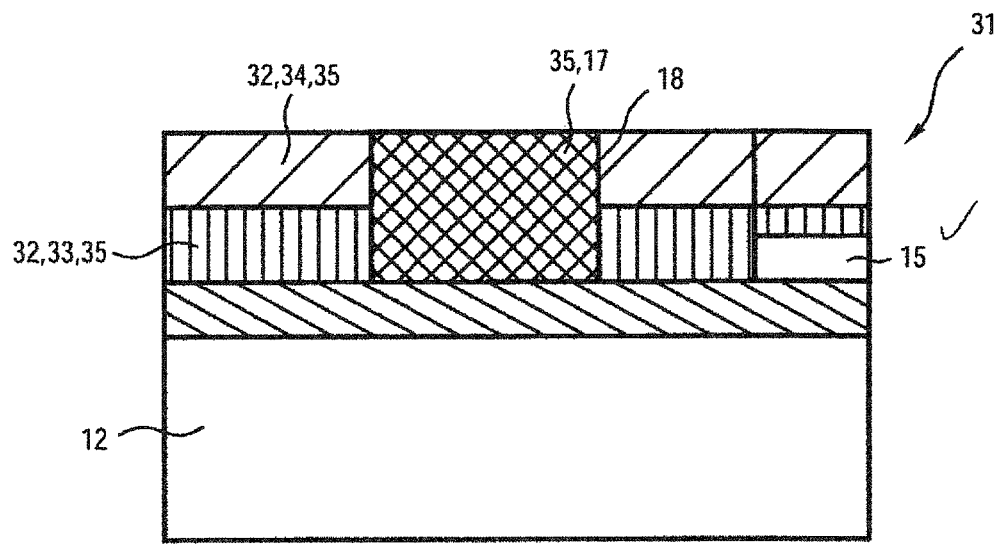
FIG. 4 shows a light source according to a third embodiment as a sectional representation in side view.

FIG. 4 shows a light source 31 according to a third embodiment as a sectional representation in side view. In contrast to the otherwise similar light source 11, the first region 32 formed as a ceramic layer now includes a lower subregion 33 or stratum not provided with activators (for example consisting of LuAG, YAG or (Ba,Sr)—SiON) and an upper subregion 34 or stratum of a luminophore layer 35 provided (for example doped) with at least one activator (for example Ce and/or Eu). The ceramic base material is preferably the same. This embodiment may also be understood as a two-layer ceramic structure, the upper subregion 34 or layer of which includes ceramic luminophore and the lower subregion 33 or layer of which includes an optically transmissive (in particular transparent) ceramic which has no wavelength conversion property.

The embodiment offers the advantage that the wavelength conversion of the first region 32 takes place further away from (above) the light-emitting surface 13 of the LED chip 12, and consequently a smaller part of the first secondary light emitted (isotropically) by the associated luminophore ions strikes the light-emitting surface than in the case of a wavelength conversion close to the light-emitting surface 13.

Another advantage is that, in this way, a smaller area of the recess 18 of the first region 32 is required because a larger amount of primary light strikes the second luminophore located in the recess 18.

This embodiment can also be advantageous in terms of production technology, and it furthermore allows a shorter thermal path through the second region 17 to the highly thermally conductive first region, and thus improved heat dissipation.

Figure 5:
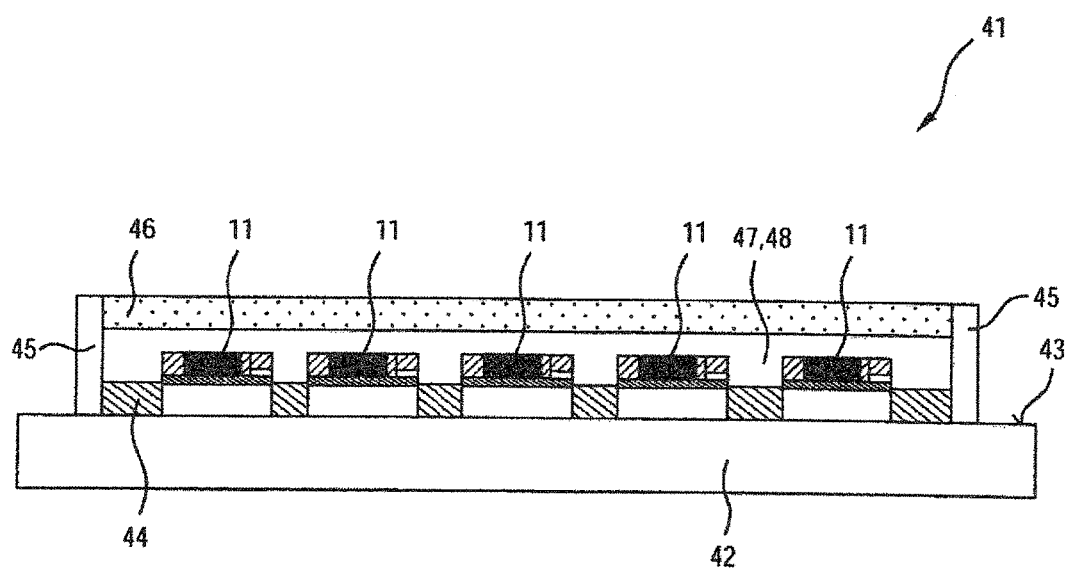
FIG. 5 shows a lighting device including a plurality of light sources according to the first embodiment as a sectional representation in side view.

FIG. 5 shows a lighting device 41 in the form of a lighting module including a plurality of light sources 11 as a sectional representation in side view. The lighting device 41 includes a common carrier 42, on the front side 43 of which a plurality of light sources 11 are arranged. The carrier 42 may, in particular, be a printed circuit board (in particular a metal-core printed circuit board for effective heat dissipation) or a ceramic substrate. The carrier 42 may, for example, be in the shape of a circular disk. The front side 43 of the carrier 42 is equipped between the light sources 11 with a reflective layer 44 in order to increase a luminous efficiency.

The light sources 11 and the reflective layer 44 are enclosed by an annularly circumferential side wall 45, which also carries a translucently light-transmissive diffuser plate 46.

The diffuser plate 46 is used as a diffusing element common to the light sources 11, and is arranged optically downstream thereof at a distance. The diffuser plate 46 increases a homogeneity of the mixed light emitted by the lighting device 41. The diffuser plate 46 may, for example, consist of silicone to which diffusely reflective particles (for example aluminum oxide particles are added.

A space 47 between the light sources 11 and the reflective layer 44, on the one hand, and the diffuser plate 46 on the other hand may be free or, as represented, filled, in particular cast, by means of a transparent silicone 48 or other polymer. Particularly in the case of a filled space 47, the diffuser plate 46 may have been provided by means of a casting process. Another alternative is that the diffuser layer is not separated from the at least one light source but, for example, directly covers the at least one light source. In this case, there is thus no additional space between the at least one light source and the diffuser layer.

Of course, the present disclosure is not restricted to the embodiments presented.

For instance, the light sources may also include third or further regions having a third or further luminophore.

Furthermore, the lighting device may also include other light sources, for example according to the second or third embodiment.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light source comprising
an LED chip having a light-emitting surface, wherein a luminophore layer is arranged on or over the LED chip and where the luminophore layer is in direct contact with the light-emitting surface of the LED chip,
wherein the luminophore layer comprises two or more adjacently arranged luminophores which comprise a first luminophore and at least a second luminophore where the second luminophore comprises a different luminophore from the first luminophore, and the second luminophore is arranged in a respective recess of the first luminophore; wherein the respective recess passes entirely through the first luminophore to the light-emitting surface of the LED chip, wherein the second luminophore is laterally completely enclosed by the first luminophore and is in direct contact with the light-emitting surface of the LED chip.

2. The light source as claimed in claim 1,
wherein the first luminophore is a ceramic luminophore; wherein the luminophore layer is a ceramic layer.

3. The light source as claimed in claim 2,
wherein a thickness of the ceramic layer lies between about 30 and about 350 micrometers.

4. The light source as claimed in claim 2,
wherein the ceramic layer comprises a lower subregion not provided with activators and an upper subregion provided with at least one activator.

5. The light source as claimed in claim 2,
wherein the ceramic layer comprises Ce-doped LuAG or YAG as a ceramic luminophore.

6. The light source as claimed in claim 2,
wherein the ceramic layer comprises Eu-doped (Ba,Sr)—SiON as a ceramic luminophore.

7. The light source as claimed in claim 1,
wherein the second luminophore is an Eu-doped nitridic luminophore.

8. The light source as claimed in claim 1,
wherein a surface fraction of the second luminophore lies between about 1/3 and about 2/3.

9. A lighting device comprising at least one light, the light source comprising
an LED chip having a light-emitting surface, wherein a luminophore layer is arranged on or over the LED chip and where the luminophore layer in direct contact with the light-emitting surface of the LED chip,
wherein the luminophore layer comprises two or more adjacently arranged luminophores which comprises a first luminophore and at least a second luminophore where the second luminophore comprises a different luminophore from the first luminophore, and the second luminophore is arranged in a respective recess of the first luminophore, wherein the respective recess passes entirely through the first luminophore to the light-emitting surface of the LED chip, wherein the second luminophore is laterally completely enclosed by the first luminophore and is in direct contact with the light-emitting surface of the LED chip.

10. The lighting device as claimed in claim 9,
wherein the lighting device comprises a housed light source.

11. The lighting device as claimed in claim 9,
wherein the lighting device comprises a plurality of light sources fitted on a common carrier.

12. The lighting device as claimed in claim 11,
wherein a common diffusing element is arranged optically downstream of the light sources.

13. The light source as claimed in claim 2,
wherein the ceramic layer is a platelet.

14. The light source as claimed in claim 3,
wherein the ceramic layer comprises a lower subregion not provided with activators and an upper subregion provided with at least one activator.

15. The light source as claimed in claim 5,
wherein Ce-doped LuAG or YAG has a Ce concentration of between about 0.5% and 3%.

16. The light source as claimed in claim 6,
wherein Eu-doped (Ba,Sr)—SiON has an Eu concentration of between about 0.5% and 2%.

17. The light source as claimed in claim 7,
wherein the Eu-doped nitridic luminophore is (Sr,Ba,Ca)2Si5N8:Eu or (Sr,Ca)AlSiN3:Eu.

18. The light source as claimed in claim 1,
wherein the second luminophore extends perpendicularly through the luminophore layer to the light-emitting surface.

19. The light source as claimed in claim 1, wherein the luminophore layer has a planar surface on the side facing away from the LED-chip.

20. A method for producing a light source:
applying a first luminophore on a light-emitting surface of an LED-chip;
forming a recess in the first luminophore;
wherein the recess entirely passes through to the light-emitting surface of the LED chip, and
filling the recess with a second luminophore to obtain a luminophore layer comprising the first luminophore and the second luminophore arranged adjacent to each other; wherein the luminophore layer is in direct contact with the light-emitting surface of the LED chip.

* * * * *